US012801012B2

(12) United States Patent
Tagami et al.

(10) Patent No.: US 12,801,012 B2
(45) Date of Patent: Nov. 17, 2026

(54) PHOTOSENSITIVE RESIN COMPOSITION AND CURED PRODUCT THEREFROM

(71) Applicant: Nippon Kayaku Kabushiki Kaisha, Tokyo (JP)

(72) Inventors: Masahiro Tagami, Tokyo (JP); Naoki Kawamoto, Tokyo (JP); Nao Honda, Tokyo (JP)

(73) Assignee: NIPPON KAYAKU KABUSHIKI KAISHA, Tokyo (JP)

( * ) Notice: Subject to any disclaimer, the term of this patent is extended or adjusted under 35 U.S.C. 154(b) by 517 days.

(21) Appl. No.: 18/384,908

(22) Filed: Oct. 30, 2023

(65) Prior Publication Data

US 2024/0168380 A1 May 23, 2024

(30) Foreign Application Priority Data

Oct. 31, 2022 (JP) ................................ 2022-174186

(51) Int. Cl.
*G03F 7/004* (2006.01)

(52) U.S. Cl.
CPC .................................. *G03F 7/0045* (2013.01)

(58) Field of Classification Search
None
See application file for complete search history.

(56) References Cited

U.S. PATENT DOCUMENTS

2011/0123928 A1* 5/2011 Senzaki ................ G03F 7/0385
430/280.1

FOREIGN PATENT DOCUMENTS

JP 63179920 A * 7/1988
JP 3817620 B2 9/2006

OTHER PUBLICATIONS

Machine translation of JP 63-179920A, published on Jul. 23, 1988 (Year: 1988).*

* cited by examiner

*Primary Examiner* — Anca Eoff
(74) *Attorney, Agent, or Firm* — Nields, Lemack & Frame, LLC

(57) ABSTRACT

The present invention relates to a photosensitive resin composition containing a cationic curable resin (A), a photocationic polymerization initiator (B), and a quencher (C), wherein the cationic curable resin (A) contains a polyfunctional epoxy resin (a-1) having a softening point of 50° C. or higher and/or an acid-modified product (a-2) of a polyfunctional epoxy resin having a softening point of 50° C. or higher in an amount of 60 mass % or more, and the quencher (C) is a compound represented by Formula (1) below:

(1)

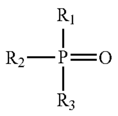

wherein $R_1$ to $R_3$ each independently represent an alkyl group or a phenyl group. $R_1$ to $R_3$ may be preferably phenyl groups. A dry film resist formed from the photosensitive resin composition and a cured product of the photosensitive resin composition are also disclosed.

6 Claims, No Drawings

PHOTOSENSITIVE RESIN COMPOSITION AND CURED PRODUCT THEREFROM

This application claims priority of Japanese Patent Application No. 2022-174186 filed on Oct. 31, 2022.

BACKGROUND OF THE INVENTION

Technical Filed

The present invention relates to a photosensitive resin composition which has excellent resolution and is useful in the production of a micro-electromechanical system (MEMS) component, a micromachine component, a microfluidic component, a micro-total analysis system (μ-TAS) component, an inkjet printer component, a microreactor component, an electrically conductive layer, an LIGA component, a mold and a stamp for microinjection molding and thermal embossing, a screen or a stencil for microprinting applications, a MEMS package component, a semiconductor package component, BioMEMS and biophotonic devices, and a printed wiring board. The present invention further relates to a cured product of the photosensitive resin composition which has excellent adhesion to a substrate and in which condensation occurring in a package during rapid temperature change is reduced.

Background Art

Resists that can be subjected to photolithography processing have recently been widely used in semiconductor and MEMS/micromachine applications. In such applications, photolithography processing is achieved by patterning exposure on a substrate and then developing with a developer to selectively remove an exposed region or a non-exposed region. Resists (photoresists) that can be subjected to photolithography processing include those of a positive type and a negative type. A resist in which an exposed portion is dissolved in a developer is of a positive type, and a resist in which an exposed portion is insoluble in a developer is of a negative type. In advanced electropackage applications and MEMS applications, not only an ability to form a uniform spin coating film, but also a high aspect ratio, a straight sidewall shape in a thick film, high adhesion to a substrate, and the like are required. Here, the aspect ratio is calculated by a resist film thickness/a pattern line width, and is an important property indicating the performance of photolithography.

As such a photoresist, for example, a negative-type chemically amplified photoresist composition containing a polyfunctional bisphenol A novolac type epoxy resin (trade name "EPON SU-8 Resin" manufactured by Resolution Performance Products, Inc.) and a photocationic polymerization initiator (the photocationic polymerization initiator is comprised of a propylene carbonate solution of an aromatic sulfonium hexafluoroantimonate) such as "CYRACURE UVI-6974" manufactured by The Dow Chemical Company is known. The photoresist composition has very low light absorption in a wavelength range of 350 to 450 nm, and therefore is known as a photoresist composition that can be subjected to thick film photolithography processing. The photoresist composition can form a solid photoresist layer having a thickness of 100 μm or more by being applied onto various substrates through a technique such as spin coating or curtain coating, followed by volatilization of a solvent by baking. Further, photolithography processing can be made by irradiating the solid photoresist layer with near-ultraviolet light through a photomask using various exposure methods such as contact exposure, proximity exposure, or projection exposure. Subsequently, a high-resolution negative image of the photomask can be formed on the substrate by immersion of the irradiated solid photoresist layer in a developer to dissolve the non-exposed region.

Meanwhile, in the fields of MEMS components, MEMS and semiconductor packages, and the like, it is known that the physical properties of a package material affect the reliability of a device. The properties of a MEMS element and a semiconductor element are deteriorated due to a change in ambient temperature or humidity or an influence of fine dust or matter, or are easily damaged by receiving mechanical vibration or impact. In order to protect the MEMS element and the semiconductor element from these external factors, the MEMS element and the semiconductor element are used in the form sealed with various materials, or in the form enclosed in a hollow structure (cavity) surrounded by outer walls of various materials, that is, in the form of a package. In the case of an airtight sealing method using a metal or a ceramic as a sealant or a material of the outer wall, a resulting package has excellent reliability, but has disadvantages such that the production cost is high and the dimensional accuracy is poor. On the other hand, in the case of resin sealing using a resin as a sealant or a material of the outer wall when a conventional resin is used, the production cost is relatively low and the dimensional accuracy is high, but there are problems in moisture resistance, heat resistance, and the like. For example, there are problems that the sealant can be peeled off from a substrate or an element due to moisture absorbed by the resin material from an external environment, and defects can be caused by an out gas generated from the package when the package is exposed to a high temperature environment. In addition, in recent years, a problem has arisen in a package having a cavity provided using a resin material that when rapid cooling is performed after a high-temperature heating step such as solder reflowing, moisture originally contained in the resin or generated by a curing reaction or the like of the resin can be condensed in the cavity to deteriorate the properties of MEMS and semiconductor elements.

Patent Literature 1 (JP-B-3817620) describes that blending a phosphine oxide derivative having a specific structure in a composition containing a compound selected from an oxetane compound and an epoxy compound and an onium salt which is a cationic polymerization initiator can improve the storage stability of the composition. However, this literature does not mention any of the resolution of the composition, the adhesion to a substrate, and an effect of reducing condensation during rapid temperature change.

CITATION LIST

Patent Literature

Patent Literature 1: JP-B-3817620

SUMMARY OF THE INVENTION

Technical Problem

An object of the present invention is to provide a novel photosensitive resin composition and a cured product therefrom that have not been developed in the prior art.

Another object of the present invention is to provide a photosensitive resin composition which preferably has excellent resolution and adhesion to a substrate and in which condensation occurring in a package during rapid temperature change is reduced.

Solution to Problem

The present inventors have surprisingly found that a photosensitive resin composition containing a specific cationic curable resin, a photocationic polymerization initiator, and a quencher having a specific structure can solve the above-mentioned problems, and they have then completed the present invention.

The present invention relates to the following aspects or embodiments.

[1]

A photosensitive resin composition, comprising: a cationic curable resin (A), a photocationic polymerization initiator (B), and a quencher (C), wherein the cationic curable resin (A) contains a polyfunctional epoxy resin (a-1) having a softening point of 50° C. or higher and/or an acid-modified product (a-2) of a polyfunctional epoxy resin having a softening point of 50° C. or higher in an amount of 60 mass % or more, and the quencher (C) contains a compound represented by Formula (1) below:

(1)

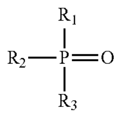

wherein $R_1$ to $R_3$ each independently represent an alkyl group or a phenyl group.

[2]

The photosensitive resin composition according to item [1], wherein $R_1$ to $R_3$ are phenyl groups.

[3]

A dry film resist formed from the photosensitive resin composition according to item [1].

[4]

A dry film resist formed from the photosensitive resin composition according to item [2].

[5]

A cured product of the photosensitive resin composition according to item [1].

[6]

A cured product of the photosensitive resin composition according to item [2].

Advantageous Effects of Invention

According to the present invention, a novel photosensitive resin composition and a cured product therefrom, which have not been developed in the prior art, are provided.

In addition, the photosensitive resin composition according to a preferred aspect of the present invention has excellent resolution and adhesion to a substrate, and can also exhibit an effect of reducing condensation occurring in a package during rapid temperature change. Therefore, the photosensitive resin composition can be suitably used for a MEMS component, a micromachine component, a semiconductor package component, and the like.

DESCRIPTION OF THE EMBODIMENTS

Hereinafter, the present invention will be described.

The photosensitive resin composition of the present invention contains a cationic curable resin (A), a photocationic polymerization initiator (B), and a quencher (C), in which the cationic curable resin (A) contains a polyfunctional epoxy resin (a-1) having a softening point of 50° C. or higher and/or an acid-modified product (a-2) of a polyfunctional epoxy resin having a softening point of 50° C. or higher in an amount of 60 mass % or more, and the quencher (C) contains a compound represented by Formula (1).

The cationic curable resin (A) (hereinafter simply referred to as "component (A)") contains a polyfunctional epoxy resin (a-1) (hereinafter simply referred to as "component (a-1)") having a softening point of 50° C. or higher and/or an acid-modified product (a-2) of a polyfunctional epoxy resin (hereinafter simply referred to as "component (a-2)") having a softening point of 50° C. or higher in an amount of 60 mass % or more based on the entire mass of component (A). When the cationic curable resin (A) contains component (a-1) and/or component (a-2) having a softening point of 50° C. or higher in an amount of 60 mass % or more, occurrence of condensation in the package during a reflow test or stickiness of a film obtained using the photosensitive resin composition can be prevented.

The content of component (a-1) and/or component (a-2) in component (A) may be preferably 65 mass % or more, more preferably 70 mass % or more, and still more preferably 75 mass % or more.

Component (a-1) is not particularly limited as long as it is a polyfunctional epoxy resin having a softening point of 50° C. or higher and containing two or more epoxy groups in one molecule. Examples of component (a-1) include a novolac type epoxy resin having a softening point of 50° C. or higher, which is obtained by reacting: a novolac obtained by reacting a phenol compound (such as phenol, an alkyl-substituted phenol, naphthol, an alkyl-substituted naphthol, dihydroxybenzene, or dihydroxynaphthalene) with formaldehyde in the presence of an acidic catalyst; with a halohydrin such as epichlorohydrin or methyl epichlorohydrin.

Specific examples of component (a-1) include KM-N-LCL, EOCN-102S, EOCN-103S, EOCN-104S, EOCN-1020, EOCN-4400H, EPPN-201, EPPN-501, EPPN-502, XD-1000, BREN-S, NC-3000H, NC-7000L, NC-6000H, and GTR-1800 (all are trade names, manufactured by Nippon Kayaku Co., Ltd.).

The softening point of component a-1) may be preferably 50° C. or higher and 120° C. or lower, and more preferably 60° C. or higher and 110° C. or lower. The softening point referred to in the present specification is a value measured by a method according to the ring and ball method in JIS K 7234.

The epoxy equivalent of component (a-1) may be preferably 100 g/eq. or more and 500 g/eq. or less, and more preferably 200 g/eq. or more and 350 g/eq. or less. The epoxy equivalent referred to in the present specification is a value measured by a method according to JIS K 7236.

Component (a-2) is an acid-modified product of a polyfunctional epoxy resin, which is obtained by reacting: a polybasic acid anhydride (z) (hereinafter simply referred to as "component (z)"); with an alcoholic hydroxy group of a reaction product (xy) of an epoxy compound (x) (hereinafter simply referred to as "component (x)") having two or more epoxy groups and a monocarboxylic acid compound (y) (hereinafter simply referred to as "component (y)") having an alcoholic hydroxy group.

Component (x), which is a raw material of component (a-2), is not particularly limited as long as it is a compound having two or more epoxy groups, and examples thereof include bifunctional epoxy resins having epoxy groups at both ends, such as a bisphenol A type epoxy resin, a bisphenol F type epoxy resin, and a bisphenol S type epoxy resin. The epoxy equivalent of component (x) may be usually 300 g/eq. or more and 1,300 g/eq, or less, preferably 500 g/eq. or more and 1,200 g/eq. or less, and more preferably 700 g/eq. or more and 1,100 g/eq. or less. The softening point of component (x) may be preferably 50° C. or higher and 120° C. or lower, and more preferably 60° C. or higher and 110° C. or lower. Specific examples of component (x) having such an epoxy equivalent include bisphenol A type epoxy resins such as jER 1003 and jER 1004 (manufactured by Mitsubishi Chemical Corporation) and bisphenol F type epoxy resins such as jER 4004P and jER 4005P (manufactured by Mitsubishi Chemical Corporation).

Examples of component (y) which is a raw material of component (a-2) include monomethylol propionic acid, dimethylol propionic acid, monomethylol butanoic acid, and dimethylol butanoic acid. Component (y) may be preferably dimethylol propionic acid and dimethylol butanoic acid because a large amount of an alcoholic hydroxy group that can react with component (z) can be introduced into a reaction product of component (x) and component (y). These compounds for component (y) may be used alone, or two or more of these compounds may be used in admixture.

The reaction between component (x) and component (y) is usually performed in a solvent having no hydroxy group. Examples of the solvent include ketones such as acetone, ethyl methyl ketone, cyclopentanone, and cyclohexanone, aromatic hydrocarbons such as benzene, toluene, xylene, and tetramethylbenzene, glycol ethers such as ethylene glycol dimethyl ether, ethylene glycol diethyl ether, dipropylene glycol dimethyl ether, and dipropylene glycol diethyl ether, esters such as ethyl acetate, butyl acetate, butyl cellosolve acetate, carbitol acetate, propylene glycol monomethyl ether acetate, and γ-butyrolactone, alcohols such as methanol, ethanol, cellosolve, and methyl cellosolve, aliphatic hydrocarbons such as octane and decane, and petroleum-based solvents such as petroleum ether, petroleum naphtha, hydrogenated petroleum naphtha, and solvent naphtha.

In the reaction between component (x) and component (y), it is preferable to use a catalyst in order to accelerate the addition reaction. Specific examples of the catalyst include triethylamine, benzyldimethylamine, triethylammonium chloride, benzyltrimethylammonium bromide, benzyltrimethylammonium iodide, triphenylphosphine, triphenylstibine, chromium octanoate, and zirconium octanoate. The amount of the catalyst used may be usually 0.1 mass % or more and 10 mass % or less with respect to the total amount of component (x) and component (y). The reaction temperature may be usually 60° C. or higher and 150° C. or lower, and the reaction time may be usually 5 hours or more and 60 hours or less.

The addition ratio of the carboxy group of component (y) to the epoxy group of component (x) may be preferably 80 equivalent % or more, more preferably 90 equivalent % or more, still more preferably 100 equivalent % of the epoxy group of component (x). When the addition ratio of the carboxy group of component (y) to the epoxy group of component (x) is 80 equivalent % or more, a large amount of the alcoholic hydroxy group derived from component (y) can be introduced into the reaction product of components (x) and (y), and as a result, the amount of component (z) added to the reaction product of components (x) and (y) can increase, by which the developability of the photosensitive resin composition can be improved.

Examples of component (z) which s a raw material of component (a-2) include succinic anhydride, phthalic anhydride, tetrahydrophthalic anhydride, hexahydrophthalic anhydride, maleic anhydride, trimellitic anhydride, and pyromellitic anhydride. Component (z) may be preferably succinic anhydride, phthalic anhydride, tetrahydrophthalic anhydride, hexahydrophthalic anhydride, or maleic anhydride, and more preferably tetrahydrophthalic anhydride. These compounds for component (z) may be used alone, or two or more of these compounds may be used in admixture.

The addition reaction of the reaction product of component (x) and component (y) with component (z) may be performed only by adding a necessary amount of component (z) to a solution containing the reaction product of components (x) and (y) obtained above and heating the solution. The reaction temperature may be usually 60° C. or higher and 150° C. or lower, and the reaction time may be usually 5 hours or more and 10 hours or less.

The addition ratio of the acid anhydride group of component (z) to the alcoholic hydroxy group of the reaction product of components (x) and (y) may be preferably 80 equivalent % or more, more preferably 90 equivalent % or more, and still more preferably 100 equivalent % of the alcoholic hydroxy group of the reaction product of components (x) and (y). When the addition ratio of the acid anhydride group of component (z) to the alcoholic hydroxy group of the reaction product of components (x) and (y) is 80 equivalent % or more, a large amount of the carboxy group can be introduced by the addition reaction of component (z), and the alkali developability of the photosensitive resin composition can be improved.

The acid value of solid content of component (a-2) obtained by the above-mentioned method may be preferably 90 mg·KOH/g or more and 105 mg·KOH/g or less. The acid value of solid content referred to in the present specification is a value measured by a method according to JIS K 0070.

The softening point of component (a-2) may be preferably 50° C. or higher and 120° C. or lower, and more preferably 60° C. or higher and 110° C. or lower. The method of measuring the softening point herein is similar to the method described above for component (a-1).

The weight average molecular weight of component (a-2) may be preferably 500 or more and 15,000 or less, and more preferably 500 or more and 9,000 or less. The weight average molecular weight herein is a value in terms of polystyrene measured by gel permeation chromatography using THF as an eluent.

Component (A) may contain less than 40 mass % of a cationic polymerizable resin (a-3) (hereinafter simply referred to as "component (a-3)") other than component (a-1) and component (a-2).

Component (a-3) is not particularly limited as long as it is a compound (resin) other than component (a-1) and component (a-2) and having a cationic polymerizable functional group. Examples of component (a-3) include glycidyl ether type epoxy compounds (such as a bisphenol A type glycidyl ether and a bisphenol F type glycidyl ether) which are liquid at normal temperature; alicyclic glycidyl ether type epoxy compounds (such as a hydrogenated bisphenol A type glycidyl ether and a hydrogenated bisphenol F type glycidyl ether), aliphatic glycidyl ether type epoxy compounds, alicyclic epoxy compounds, and epoxy-modified siloxane compounds. The compounds for component (a-3) may be used alone, or two or more of the compounds may be used in combination.

Specific examples of component (a-3) include JER-828, JER-806, and YX-8000 (manufactured by Mitsubishi Chemical Corporation), Celloxide 2021P (manufactured by Daicel Corporation), Denacol EX-321 and Denacol EX-145 (manufactured by Nagase ChemteX Corporation), and TEPIC-VL (manufactured by Nissan Chemical Corporation).

The photocationic polymerization initiator (B) (hereinafter simply referred to as "component (B)") used in the photosensitive resin composition is a compound that generates a cation upon irradiation with ultraviolet light, far-ultraviolet light, an excimer laser such as KrF or ArF, or radiation such as an X-ray or an electron beam, and enables the cation to initiate a polymerization reaction of the cationic curable resin (A) such as an epoxy resin. Component (B) is not particularly limited as long as it is a conventionally known photocationic polymerization initiator. Typical examples of component (B) include an aromatic iodonium complex salt and an aromatic sulfonium complex salt.

Specific examples of the aromatic iodonium complex salt include diphenyliodonium tetrakis(pentafluorophenyl)borate, diphenyliodonium hexafluorophosphate, diphenyliodonium hexafluoroantimonate, di(4-nonylphenyl)iodonium hexafluorophosphate, tolylcumyliodonium tetrakis(pentafluorophenyl)borate (trade name: Rhodorsil PI2074 manufactured by Rhodia), and di(4-tertiary-butyl)iodonium tris(trifluoromethanesulfonyl)methanide (trade name: CGI BBI-C1 manufactured by BASF SE).

Specific examples of the aromatic sulfonium complex salt include 4-thiophenyldiphenylsulfonium hexafluoroantimonate (trade name: CPI-101A manufactured by San-Apro Ltd.), thiophenyldiphenylsulfonium tris(pentafluoroethyl)trifluorophosphate (trade name: CPI-2105 manufactured by San-Apra Ltd.), 4-{4-(2-chlorobenzoyl)phenylthio}phenyl bis(4-fluorophenyl)sulfonium hexafluoroantimonate (trade name: SP-172 manufactured by ADEKA CORPORATION), a mixture of aromatic sulfonium hexafluoroantimonate containing 4-thiophenyldiphenylsulfonium hexafluoroantimonate (trade name: CPI-6976 manufactured by ACETO Corporation USA), triphenylsulfonium tris(trifluoromethanesulfonyl)methanide (trade name: CGI TPS-C1 manufactured by BASF SE), tris[4-(4-acetylphenyl)sulfonylphenyl]sulfonium tris(trifluoromethylsulfonyl)methide (trade name: GSID 26-1 manufactured by BASF SE), and tris[4-(4-acetylphenyl)sulfonylphenyl]sulfonium tetrakis(2,3,4,5,6-pentafluorophenyl)borate (trade name: Irgacure 290 (PAG 290) manufactured by BASF SE).

Among these compounds for component (B), an aromatic sulfonium complex salt having high vertical rectangular processability and high thermal stability in a photosensitive image forming step is preferable. Among them, 4-{4-(2-chlorobenzoyl)phenylthio}phenyl bis(4-fluorophenyl)sulfonium hexafluoroantimonate, a mixture of aromatic sulfonium hexafluoroantimonates containing 4-thiophenyldiphenylsulfonium hexafluoroantimonate, or tris[4-(4-acetylphenyl)sulfonylphenyl]sulfonium tetrakis(2,3,4,5,6-pentafluorophenyl)borate is more preferable as component (B).

The compounds for component (B) may be used alone or two or more of the compounds may be used in combination in the photosensitive resin composition.

The content of component (B) in the photosensitive resin composition may be usually 0.1 mass % or more and 10 mass % or less, and preferably 0.5 mass % or more and 5 mass % or less with respect to component (A). In another aspect, the blending ratio of component (B) in the photosensitive resin composition may be 0.1 mass % or more and 5 mass % or less, or 0.5 mass % or more and 10 mass % or less with respect to component (A). However, when the molar absorption coefficient at a wavelength of 300 nm or more and 380 nm or less of component (B) is high, it is desirable to adjust the blending amount to an appropriate amount according to the film thickness of a film formed from the photosensitive resin composition.

The photosensitive resin composition contains a quencher (C) (hereinafter simply referred to as "component (C)") represented by Formula (1). In Formula (1 $R_1$ to $R_3$ each independently represent an alkyl group or a phenyl group.

The alkyl group represented by $R_1$ to $R_3$ in Formula (1) may be linear or branched, and the number of carbon atoms thereof is also not particularly limited. The alkyl group represented by $R_1$ to $R_3$ may be preferably a linear or branched alkyl group having 1 to 10 carbon atoms.

The alkyl group and the phenyl group represented by $R_1$ to $R_3$ in Formula (1) may have a substituent. The "alkyl group having a substituent" as used herein is an alkyl group in which a hydrogen atom of the alkyl group is substituted with a substituent, and the number of substituents in the alkyl group is not particularly limited. The substituent of the alkyl group is not particularly limited, and examples thereof include a hydroxy group, a halogen atom, and an aryl group. The "phenyl group having a substituent" as used herein is a phenyl group in which a hydrogen atom of the phenyl group is substituted with a substituent, and the number of substituents in the phenyl group is not particularly limited. The substituent of the phenyl group is not particularly limited, and examples thereof include a hydroxy group, a halogen atom, an alkyl group, and an aryl group.

$R_1$ to $R_3$ in Formula (1) may be preferably each independently a linear or branched alkyl group having 1 to 10 carbon atoms or a phenyl group, and it is more preferable that $R_1$ to $R_3$ are the identical linear or branched alkyl group having 1 to 10 carbon atoms or the identical phenyl group.

Specific examples of component (C) include tributylphosphine oxide (TBPO), triphenylphosphine oxide (TPPO), tri(3-hydroxypropyl)phosphine oxide, and n-butyl-bis(3-hydroxypropyl)phosphine oxide.

The content of component (C) in the photosensitive resin composition may be usually 0.1 mass % or more and 50 mass % or less, and preferably 1 mass % or more and 30 mass % or less with respect to the content of component (B). When the content of component (C) is within the above-mentioned range, the effect of reducing condensation and/or excellent curability of the photosensitive resin composition can be exhibited.

A known quencher other than the compound represented by Formula (1) may be used in combination with component (C) as long as the effect of the invention is not impaired. However, when a quencher other than the compound represented by Formula (1) is used in combination, an acid capture ability may become too high, so that the reaction is inhibited more than necessary, and the sensitivity is greatly reduced, or conversely, the acid capture ability may become too low, so that the effect of preventing condensation may be reduced. Therefore, it is preferable to use only the compound represented by Formula (1) for component (C).

A solvent may be added to the photosensitive resin composition in order to lower the viscosity of the composition and improve the coatability of the photosensitive resin composition on various substrates and the like. As the solvent, any solvent can be used without any particular limitations as long as it is an organic solvent usually used in inks, paints, or the like and can dissolve components of the photosensitive resin composition. Specific examples of the solvent include ketones such as acetone, ethyl methyl ketone, 2-butanone, cyclohexanone, and cyclopentanone, aromatic hydrocarbons such as toluene, xylene, and tetramethylbenzene, glycol ethers such as ethylene glycol dimethyl ether, dipropylene glycol dimethyl ether, and dipropylene glycol diethyl ether, esters such as ethyl acetate, butyl acetate, butyl cellosolve acetate, carbitol acetate, propylene glycol monomethyl ether acetate, and γ-butyrolactone, alcohols such as methanol, ethanol, cellosolve, and methyl cellosolve, aliphatic hydrocarbons such as octane and decane, and petroleum-based solvents such as petroleum ether, petroleum naphtha, hydrogenated petroleum naphtha, and solvent naphtha.

The content of the solvent in the photosensitive resin composition may be preferably 95 mass % or less, more preferably 10 mass % or more and 90 mass % or less in the photosensitive resin composition.

In the photosensitive resin composition, a miscible adhesion imparting agent may be used for the purpose of improving the adhesion of the composition to the substrate. As the adhesion imparting agent, a coupling agent such as a silane coupling agent or a titanium coupling agent can be used. The adhesion imparting agent may be preferably a slime coupling agent.

Examples of the silane coupling agent include 3-chloropropyltrimethoxysilane, vinyl trichlorosilane, vinyl triethoxysilane, vinyl trimethoxysilane, vinyl tris(2-methoxyethoxy) silane, 3-methacryloxypropyltrimethoxysilane, 2-(3,4-epoxycyclohexyl)ethyltrimethoxysilane, 3-glycidoxypropyltrimethoxysilane, 3-mercaptopropyltrimethoxysilane, 3-aminopropyltriethoxysilane, N-2-(aminoethyl)-3-aminopropyltrimethoxysilane, and 3-ureidopropyltriethoxysilane. These adhesion imparting agents can be used alone, or two or more of these adhesion imparting agents can be used in combination.

The adhesion imparting agent, when excessively added, may remain in an unreacted state in a cured product even after the photosensitive resin composition is cured, and it may adversely affect various physical properties of the cured product. The adhesion imparting agent can exhibit the effect even in a small amount depending on the type of the substrate, and thus, it is appropriate to use the adhesion imparting agent to an extent that a deterioration in the physical properties may not be caused. When the adhesion imparting agent is used, the proportion of the adhesion imparting agent in the photosensitive resin composition may be preferably 15 mass % or less, and more preferably 5 mass % or less. In one embodiment, the photosensitive resin composition does not contain the adhesion imparting agent.

In the photosensitive resin composition, a sensitizer may be used for further absorbing ultraviolet light and providing the absorbed light energy to the photocationic polymerization initiator. For example, the sensitizer may be preferably a thioxanthone and an anthracene compound having alkoxy groups at positions 9 and 10 (i.e., a 9,10-dialkoxyanthracene derivative). Examples of the alkoxy group of the 9,10-dialkoxyanthracene derivative include alkoxy groups having 1 to 4 carbon atoms, such as a methoxy group, an ethoxy group, a propoxy group, and a butoxy group. The 9,10-dialkoxyanthracene derivative may further have a substituent. Examples of such a substituent include halogen atoms such as a fluorine atom, a chlorine atom, a bromine atom, and an iodine atom, alkyl groups having 1 to 4 carbon atoms such as a methyl group, an ethyl group, and a propyl group, a sulfonic acid alkyl ester group, and a carboxylic acid alkyl ester group. Examples of the alkyl in the sulfonic acid alkyl ester group or the carboxylic acid alkyl ester group include an alkyl having 1 to 4 carbon atoms, such as methyl, ethyl, and propyl. Such a substituent of the 9,10-dialkoxyanthracene derivative may be preferably located at position 2. In one embodiment, the photosensitive resin composition does not contain the sensitizer.

Specific examples of the thioxanthone include 2,4-dimethylthioxanthone, 2,4-diethylthioxanthone, 2-chlorothioxanthone, 2-isopropylthioxanthone, 2,4-diisopropylthioxanthone, and 2-isopropylthioxanthone. The thioxanthone may be preferably 2,4-diethylthioxanthone (trade name: KAYAGURE DETX-S manufactured by Nippon Kayaku Co., Ltd) or 2-isopropylthioxanthone.

Examples of the 9,10-dialkoxyanthracene derivative include 9,10-dimethoxyanthracene, 9,10-diethoxyanthracene, 9,10-dipropxyanthracene, 9,10-dibutoxyanthracene, 9,10-dimethoxy-2-ethylanthracene, 9,10-diethoxy-2-ethylanthracene, 9,10-dipropoxy-2-ethylanthracene, 9,10-dimethoxy-2-chloroanthracene, 9,10-dimethoxyanthracene-2-sulfonic acid methyl ester, 9,10-diethoxyanthracene-2-sulfonic acid methyl ester, and 9,10-dimethoxyanthracene-2-carboxylic acid methyl ester.

These sensitizers can be used alone, or two or more of these sensitizers can be used in admixture. The use of 2,4-diethylthioxanthone and 9,10-dimethoxy-2-ethylanthracene is most preferable. The sensitizer component can exhibit the desired effect in a small amount. Therefore, when the sensitizer is used, the ratio of the sensitizer component to component (B) may be preferably 30 mass % or less, and more preferably 20 mass % or less.

When it is necessary to reduce an adverse effect of ions derived from component (B), an ion catcher such as an alkoxyaluminum such as trismethoxyaluminum, trisethoxyaluminum, trisisopropoxyaluminum, isopropoxydiethoxyaluminum, or trisbutoxyaluminum, a phenoxyaluminum such as trisphenoxyaluminum or trisparamethylphenoxyaluminum, or an organoaluminum compound such as trisacetoxyaluminum, aluminum trisstearate, aluminum trisbutyrate, aluminum trispropionate, aluminum trisacetylacetonate, aluminum tristrifluoroacetylacetonate, aluminum trisethylacetoacetate, aluminum diacetylacetonatedipivaloylmethanate, or aluminum diisopropoxy(ethylacetoacetate) may be added to the photosensitive resin composition. These ion catchers can be used alone, or two or more of these ion catchers can be used in combination. When the ion catcher is used, the percentage of the ion catcher based on the total solids (all components excluding the solvent) of the photosensitive resin composition may be 10 mass % or less. In one embodiment, the photosensitive resin composition does not contain the ion catcher.

In the photosensitive resin composition, a leveling agent may be further used for the purpose of reducing the surface tension and improving the film coating properties. Examples of the leveling agent include a fluorine-based leveling agent (FTERGENT 100, 300, 251, 222F, 710FL, and 601AD manufactured by NEOS Co., Ltd.), a silicone-based leveling agent (DISPARLON 711EF, 1761, LS-001, and LS-460 manufactured by Kusumoto Chemicals, Ltd.), and an acrylic leveling agent (DISPARLON 1970, 230, and LF-1980 manufactured by Kusumoto Chemicals, Ltd.).

These leveling agents can be used alone, or two or more of these leveling agents can be used in combination. When the leveling agent is used, the percentage of the leveling agent based on the total solids (all components excluding the solvent) of the photosensitive resin composition may be preferably 0.01 mass % or more and 1 mass % or less. In one embodiment, the photosensitive resin composition does not contain the leveling agent.

To the photosensitive resin composition, various additives such as a thermoplastic resin, a colorant, a thickener, and an antifoaming agent can be further added (or does not have to be added) as necessary. Examples of the thermoplastic resin include a polyethersulfone, a polystyrene, and a polycarbonate. Examples of the colorant include phthalocyanine blue, phthalocyanine green, iodine green, crystal violet, titanium oxide, carbon black, and naphthalene black. Examples of the thickener include orbene, bentone, and montmorillonite. Examples of the antifoaming agent include silicone-based, fluorine-based, and polymer-based antifoaming agents. When these additives and the like are used, the amount of each of the additives used may be, for example, 30 mass % or less in the photosensitive resin composition as a rough guide. The amount can be appropriately increased or decreased according to the purpose of use.

For example, an inorganic filler such as barium sulfate, barium titanate, silicon oxide, amorphous silica, talc, clay, magnesium carbonate, calcium carbonate, aluminum oxide, aluminum hydroxide, or mica powder can be added to the photosensitive resin composition. When the inorganic filler is used, the amount of the inorganic filler added may be 60 mass % or less in the photosensitive resin composition. In one embodiment, the photosensitive resin composition does not contain the inorganic filler.

The photosensitive resin composition can be prepared only by blending component (A), component (B), and component (C), which are essential components, and a solvent and/or various additives as necessary, followed by mixing and stirring by an ordinary method. If necessary, the mixture may be dispersed and mixed using a disperser such as a dissolver, a homogenizer, or a three-roll mill. After the mixing, the mixture may be further filtered using a mesh, a membrane filter, or the like.

The photosensitive resin composition may be preferably used in the form of a solution to which a solvent is added. First, for example, a photosensitive resin composition dissolved in a solvent can be applied in a thickness of 0.1 to 1,000 μm using a spin coater to a metal substrate made of silicon, aluminum, or copper, a ceramic substrate made of lithium tantalite, glass, silicon oxide, or silicon nitride, or a substrate of a polyimide, a polyethylene terephthalate, or the like. Subsequently, the solvent may be removed under heating conditions of 60 to 130° C. for about 5 to 60 minutes to form a photosensitive resin composition layer, followed by prebaking, and then, a mask having a predetermined pattern may be placed thereon, and the resultant can be irradiated with ultraviolet light. Subsequently, a heat treatment (post-exposure baking) may be performed at 50 to 130° C. for about 1 to 50 minutes, and thereafter, a development treatment may be performed for an unexposed portion at room temperature to 50° C. for about 1 to 180 minutes using a developer, whereby a pattern can be formed. Finally, a heat treatment (hard baking treatment) may be performed at 130 to 230° C., whereby a cured product satisfying various properties can be obtained. These treatment conditions are not limited and are typical examples. As the developer, for example, an organic solvent such as γ-butyrolactone, triethylene glycol dimethyl ether, or propylene glycol monomethyl ether acetate, or a mixed liquid of the organic solvent and water can be used. In the development, a developing device such as a paddle type, a spray type, or a shower type may be used. Ultrasonic irradiation may be performed as necessary. Examples of a preferred metal substrate in use of the photosensitive resin composition include a substrate made of aluminum.

The photosensitive resin composition can be formed into a dry film resist by applying the composition onto a base film using a roll coater, a die coater, a knife coater, a bar coater, a gravure coater, or the like, then drying the composition in a drying furnace set at 45 to 100° C. to remove a predetermined amount of the solvent, and laminating a cover film or the like thereon as necessary. At this time, the thickness of the resist on the base film can be controlled within the range of from 2 to 100 μm. As the base film and the cover film, for example, films of a polyester, a polypropylene, a polyethylene, TAC, a polyimide, and the like are used. These films may be subjected to a release treatment with a silicone-based release treatment agent, a non-silicone-based release treatment agent, or the like as necessary. In order to use the dry film resist, for example, the following procedure may be performed: the cover film is peeled off, the film resist is transferred to the substrate at a temperature of 40 to 100° C. and a pressure of 0.05 to 2 MPa using a hand roll, a laminator, or the like, followed by exposure, post-exposure baking, development, and a heat treatment in the same manner as for the photosensitive resin composition dissolved in the solvent.

When the photosensitive resin composition is supplied as a dry film as described above, the steps of application on the support and drying can be omitted. This makes it possible to more easily form a pattern of a cured product using the photosensitive resin composition.

When a MEMS device or a semiconductor device is used as a MEMS package or a semiconductor package, the MEMS device or the semiconductor device may be coated with the photosensitive resin composition, or a hollow structure may be produced for a MEMS device or a semiconductor device with the photosensitive resin composition. As a substrate of the MEMS or semiconductor package, a substrate obtained by depositing a metal thin film of aluminum, gold, copper, chromium, titanium, or the like to a thickness of 10 to 5.000 Å by sputtering or vapor deposition on a silicon wafer with any of various shapes and finely processing the metal by an etching method or the like can be used. In some cases, silicon oxide or silicon nitride may be further deposited to a thickness of 10 to 10,000 Å as an inorganic protective film. Subsequently, a MEMS or semiconductor device is produced or installed on the substrate, and it is necessary to perform coating or produce a hollow structure in order to isolate the device from the outside air. When coating is performed with the photosensitive resin composition, the coating can be performed in the same manner as for the formation of the cured product. In addition, when a hollow structure is produced, a hollow package structure can be produced by forming a partition wall on the substrate in the same manner as for the formation of the cured product, and further laminating the dry film and patterning the thy film so that the dry film may serve as a lid on the partition wall. In addition, a MEMS package component and a semiconductor package component satisfying various properties can be obtained by performing a heat treatment at 130 to 200° C. for 10 to 120 minutes as necessary after the production.

The "package" is a sealing method used to block infiltration of a gas or liquid in the outside air in order to maintain the stability of the substrate, wiring, an element, and the like, or a product produced thereby. The term "package" as used herein refers to a package having a drive unit such as a MEMS, a hollow package for packaging a vibrator such as a SAW device, surface protection, resin sealing, or the like performed to prevent deterioration of a semiconductor substrate, a printed wiring board, wiring, and the like. The term "wafer level package" as used herein refers to a packaging method in which a series of processing steps of the formation of a protective film formation, the installation of terminals, wiring and packaging is performed in the form of a wafer, and then, the wafer is cut into chips, or a product produced thereby.

The photosensitive resin composition can exhibit a high elastic modulus. Therefore, the photosensitive resin composition can be suitably used, for example, in the production of a microelectromechanical system (MEMS) component, a micromachine component, a microfluidic component, a micro-total analysis system (μ-TAS) component, an inkjet printer component, a microreactor component, an electrically conductive layer, an LIGA component, a mold and a stamp for microinjection molding and thermal embossing, a screen or a stencil for microprinting applications, a MEMS package component, a semiconductor package component, BioMEMS and biophotonic devices, and a printed wiring board. In particular, the photosensitive resin composition is useful in a MEMS package component and a semiconductor package component.

EXAMPLES

Hereinafter, the present invention will be described with reference to examples. These examples are just illustration for describing the present invention in a suitable manner, and the scope of the present invention is not limited to the following examples.

Synthesis Example 1 (Synthesis of Component (A): Acid-Modified Product a-2) of Polyfunctional Epoxy Resin)

Into a 5 L flask, 429.5 parts of cyclopentanone as a reaction solvent and 868.0 parts of jER-4004P (bisphenol F type epoxy resin manufactured by Mitsubishi Chemical Corporation, epoxy equivalent: 868 g/eq.) as component (x) were charged and heated to 120° C. to dissolve the resin. To the resin solution, 134.1 parts of dimethylol propionic acid as component (y) and 1.43 parts of triphenylphosphine as a reaction catalyst were added and allowed to react at 120° C. for 26 hours. After it was checked that the acid value of the reaction liquid reached 7 mg·KOH/g or less, 304.3 parts of tetrahydrophthalic anhydride as component (z) and 272.5 parts of cyclopentanone were added and allowed to react at 80° C. for 8 hours to obtain a cyclopentanone solution of the component (a-2) (an acid-modified product (A-8) of a polyfunctional epoxy resin) with an acid value of solid content being 99.6 mg·KOH/g.

Examples 1 to 15 and Comparative Examples 1 to 11 (Preparation of Photosensitive Resin Compositions)

The essential components (A) to (C) and other optional components in the amounts (unit: parts by mass) as shown in each of Tables 1 to 4 were stirred and mixed in a flask with a stirrer at 60° C. for 2 hours to obtain photosensitive resin compositions according to the present invention and photosensitive resin compositions for comparison. The component (a-2) (i.e., the acid-modified product (A-8) of a polyfunctional epoxy resin) obtained in Synthesis Example 1 was in the form of the cyclopentanone solution, but when the cyclopentanone solution was used for forming a composition, it was used by volatilizing the cyclopentanone solvent and then re-dissolving the residue in the solvent of the formulation shown in the table. The blending amount of each component shown in Tables 1 to 4 indicates parts by mass of the solid content.

A-1 to A-15, B-1, C-1 to C-4, D, E, and F in Tables 1 to 4 are as follows.

Component (A): Cationic Curable Resin

- (A-1): a bisphenol A novolac type epoxy resin (trade name: KM-N-LCL manufactured by Nippon Kayaku Co., Ltd., softening point: 85° C., epoxy equivalent: 210 g/eq., denoted by "KM-N LCL" in each table)
- (A-2): a biphenyl aralkyl type epoxy resin (trade name: NC-3000H manufactured by Nippon Kayaku Co., Ltd., softening point: 57° C., epoxy equivalent: 276 g/eq.)
- (A-3): a cresol novolac type epoxy resin (trade name: EOCN-104S manufactured by Nippon Kayaku Co., Ltd., softening point: 90° C., epoxy equivalent: 220 g/eq.)
- (A-4): a trisphenol methane type epoxy resin (trade name: EPPN-502S manufactured by Nippon Kayaku Co., Ltd., softening point: 65° C., epoxy equivalent: 170 g/eq.)
- (A-5): a trifunctional epoxy resin (trade name: NC-6700 manufactured by Nippon Kayaku Co., Ltd., softening point: 65° C. epoxy equivalent: 210 g/eq.)
- (A-6): an alicyclic epoxy resin (trade name: DE-102 manufactured by ENEOS Corporation, softening point: 86° C. epoxy equivalent: 107 g/eq.)
- (A-7): a bisphenol F type epoxy resin (trade name: JER-4007P manufactured by Nippon Kayaku Co., Ltd., softening point: 108° C., epoxy equivalent: 2.500 g/eq.)
- (A-8): an acid-modified product (A-8) of a polyfunctional epoxy resin obtained in Synthesis Example 1 (softening point: 70° C.)
- (A-9): a liquid bisphenol A type epoxy resin (trade name: RE-310S manufactured by Nippon Kayaku Co., Ltd., epoxy equivalent: 180 g/eq.)
- (A-10): a liquid phenol novolac type epoxy resin (trade name: RE-305S manufactured by Nippon Kayaku Co., Ltd., epoxy equivalent: 173 g/eq.)
- (A-11): a liquid triazine type epoxy resin (trade name: TEPIC-VL manufactured by Nissan Chemical Corporation, epoxy equivalent: 190 g/eq.)
- (A-12): a liquid aliphatic epoxy resin (trade name: EX-321L manufactured by Nagase ChemteX Corporation, epoxy equivalent: 130 g/eq.)
- (A-13): a liquid oxetane resin (trade name: OXT-221 manufactured by Toagosei Co., Ltd., oxetane equivalent: 105 g/eq.)
- (A-14): an alicyclic epoxy resin (trade name: Liquid Celloxide 2021P manufactured by Daicel Corporation, epoxy equivalent: 130 g/eq.)
- (A-15): a liquid bisphenol F type epoxy resin (trade name: YDF-8170C manufactured by Nippon Steel Chemical & Materials Co., Ltd., epoxy equivalent: 170 g/eq.)

Component (B): Photocationic Polymerization Initiator

- (B-1): trade name: Irgacure 290 manufactured by BASF SE (denoted by "Irg290" in each table)

Component (C): Quencher

- (C-1): triphenylphosphine oxide (trade name: TPPO manufactured by Hokko Chemical Co., Ltd.)
- (C-2): a hindered amine-based compound (trade name: Tinuvin 770DF manufactured by BASF SE)

(C-3): a weak acid generating photocationic polymerization initiator (trade name: SP-152 manufactured by ADEKA Corporation)

(C-4): a weak acid generating photocationic polymerization initiator (trade name: CPI-310CS manufactured by San-Apra Ltd.)

Coupling Agent (D): trade name: S-510 manufactured by JNC Corporation

Leveling Agent (E): trade name: FTERGENT 222F manufactured by NEOS Co., Ltd. (denoted by "F-222" in each table)

Solvent (F): trade name: 2-butanone manufactured by Junsei Chemical Co., Ltd.

(Application, Drying, Exposure, and Development of Photosensitive Resin Composition Layer)

Each of the photosensitive resin compositions obtained in Examples 1 to 15 and Comparative Examples 1 to 11 was applied onto a silicon wafer with a spin coater, and then, the solvent was dried to obtain a photosensitive resin composition layer of 20 μm. The photosensitive resin composition layer was prebaked on a hot plate at 65° C. for 4 minutes. Thereafter, pattern exposure (soft contact, i-line) was performed using an i-line exposure apparatus (a mask aligner manufactured by Ushio, Inc.), post-exposure baking was performed on a hot plate at 95° C. for 6 minutes, and a development treatment was performed at 23° C. for 5 minutes by an immersion method using propylene glycol monomethyl ether acetate to obtain a cured resin pattern on the substrate (silicon wafer).

(Evaluation of Resolution of Photosensitive Resin Composition)

In the pattern exposure on the silicon (Si) wafer substrate, the width of the thinnest pattern adhering to the substrate in the resist pattern resolved without residue with a line-and-space ratio of 1:1 was observed with a microscope. With respect to the width of the thinnest pattern, the resolution of the photosensitive resin composition was evaluated according to the following evaluation criteria. The results are shown in Tables 1 to 4.

Evaluation Criteria

○ (good): The width of the thinnest pattern was 10 μm or less.

x (poor): The width of the thinnest pattern exceeded 10 μm, or no pattern was formed.

(Evaluation of Adhesive Force of Photosensitive Resin Composition to Si)

The adhesive force referred to herein is a shear strength determined at the time when a force is applied from a side face part of the pattern using a shear tool and the pattern is peeled off from the substrate. A higher value is preferable because the adhesive force between the substrate and the photosensitive resin composition is greater. Specifically, a block-shaped resist pattern of 100 μm×100 μm (film thickness: 20 μm) was formed on a silicon wafer substrate at the optimum exposure dose observed as described above (i.e., at the exposure dose at which the width of the thinnest pattern was obtained). A fracture load was measured with a bonding tester (manufactured by RHESCA Co., Ltd.) when a load was applied to the resist pattern from the lateral direction at a height of 3 μm from the substrate at a speed of 50 μm/sec using a 100 μm shear tool, and the adhesive force was evaluated according to the following evaluation criteria. The results are shown in Tables 1 to 4.

Evaluation criteria

○: The adhesive force was 45 gf or more.

x: The adhesive force was less than 45 gf.

(Condensation Test of Photosensitive Resin Composition)

Patterning was performed in the same manner as described above for each of the photosensitive resin compositions obtained in Examples 1 to 15 and Comparative Examples 1 to 11 using a 6-inch silicon wafer. At this time, a photomask in a lattice shape was used so that a space having a length of 3 mm and a width of 3 mm and surrounded by a frame shape with a line having a width of 1 mm could be formed. After the patterning, a 6-inch Tempax glass wafer substrate (manufactured by Schott Nippon K.K.) having a thickness of 300 μm as an adherend was bonded onto the pattern by thermocompression (under thermocompression bonding conditions: 150° C. 10 kN, 3 minutes) to obtain a molded body of a sample for condensation test evaluation having a cavity portion. The sample was heated and cured at 180° C. for 1 hour using a convection oven to prepare a sample for evaluation. A heat cycle test including a step of heating the resulting sample on a hot plate at 260° C. for 3 minutes and a step of cooling the sample on a water-cooled cooling plate at 23° C. for 2 minutes was repeated 10 times, and then, the presence or absence of condensation occurring on the surface of the glass substrate in the cavity was checked with a microscope and evaluated according to the following evaluation criteria. The results are shown in Tables 1 to 4.

Evaluation Criteria

○: Condensation was not observed.

x: Condensation was observed.

TABLE 1

Formulations and evaluation results of photosensilive resin compositions

| Component | | | | Example 1 | 2 | 3 | 4 | 5 | 6 | 7 | 8 |
|---|---|---|---|---|---|---|---|---|---|---|---|
| Component (A) | Component (a-1) | KM-N LCL | A-1 | 80 | 60 | | | | | 80 | 80 |
| | | NG-3000M | A-2 | | | 80 | | | | | |
| | | EOCN-104S | A-3 | | | | 80 | | | | |
| | | EPPN-502S | A-4 | | | | | 80 | | | |
| | | NC-6700 | A-5 | | | | | | 80 | | |
| | | DE-102 | A-6 | | | | | | | | |
| | | JER-4007P | A-7 | | | | | | | | |
| | Component (a-2) | Synthesis Example 1 | A-8 | | | | | | | | |
| | Component (a-3) | RE-310S | A-9 | 20 | 40 | 20 | 20 | 20 | 20 | | |
| | | RE-305S | A-10 | | | | | | | 20 | |
| | | TEPIC-VL | A-11 | | | | | | | | |
| | | EX-321L | A-12 | | | | | | | | 20 |
| | | OXT-221 | A-13 | | | | | | | | |

TABLE 1-continued

Formulations and evaluation results of photosensilive resin compositions

| Component | | | | Example 1 | 2 | 3 | 4 | 5 | 6 | 7 | 8 |
|---|---|---|---|---|---|---|---|---|---|---|---|
| | | Celloxide 2021P | A-14 | | | | | | | | |
| | | YDF-8170C | A-15 | | | | | | | | |
| Component (B) | | Irg290 | B-1 | 1 | 1 | 1 | 1 | 1 | 1 | 1 | 1 |
| Component (C) | Compound of Formula (1) | TPPO | C-1 | 0.02 | 0.02 | 0.02 | 0.02 | 0.02 | 0.02 | 0.02 | 0.02 |
| | Compound other than Formula (1) | TINUBIN 770DF | C-2 | | | | | | | | |
| | | SP-152 | C-3 | | | | | | | | |
| | | CPI-310CS | C-4 | | | | | | | | |
| Coupling agent | | S-510 | D | 1.5 | 1.5 | 1.5 | 1.5 | 1.5 | 1.5 | 1.5 | 1.5 |
| Leveling agent | | F-222 | E | 0.03 | 0.03 | 0.03 | 0.03 | 0.03 | 0.03 | 0.03 | 0.03 |
| Solvent | | 2-butanone | F | 43 | 43 | 43 | 43 | 43 | 43 | 43 | 43 |
| Evaluation of resolution | | | | ○ | ○ | ○ | ○ | ○ | ○ | ○ | ○ |
| Evaluation of adhesive force | | | | ○ | ○ | ○ | ○ | ○ | ○ | ○ | ○ |
| Condensation test | | | | ○ | ○ | ○ | ○ | ○ | ○ | ○ | ○ |

TABLE 2

Formulations and evaluation results of photosensitive resin compositions

| Component | | | | Example 9 | 10 | 11 | 12 | 13 | 14 | 15 |
|---|---|---|---|---|---|---|---|---|---|---|
| Component (A) | Component (a-1) | KM-N LCL | A-1 | 80 | 80 | 80 | 80 | 80 | 80 | |
| | | NC-3000H | A-2 | | | | | | | |
| | | EOCN-104S | A-3 | | | | | | | |
| | | EPPN-502S | A-4 | | | | | | | |
| | | NC-6700 | A-5 | | | | | | | |
| | | DE-102 | A-6 | | | | 20 | | | |
| | | JER-4007P | A-7 | | | | | | | 10 |
| | Component (a-2) | Synthesis Example 1 | A-8 | | | | | | | 60 |
| | Component (a-3) | RE-310S | A-9 | | | | | 20 | 20 | |
| | | RE-305S | A-10 | | | | | | | |
| | | TEPIC-VL | A-11 | | | | | | | |
| | | EX-321L | A-12 | | | | | | | |
| | | OXT-221 | A-13 | 20 | | | | | | |
| | | Celloxide 2021P | A-14 | | 20 | | | | | |
| | | YDF-8170C | A-15 | | | 20 | | | | 40 |
| Component (B) | | Irg290 | B-1 | 1 | 1 | 1 | 2 | 1 | 1 | 2 |
| Component (C) | Compound of Formula (1) | TPPO | C-1 | 0.02 | 0.02 | 0.02 | 0.02 | 0.1 | 0.2 | 0.15 |
| | Compound other than Formula (1) | TINUBIN 770DF | C-2 | | | | | | | |
| | | SP-152 | C-3 | | | | | | | |
| | | CPI-310CS | C-4 | | | | | | | |
| Coupling agent | | S-510 | D | 1.5 | 1.5 | 1.5 | 0 | 1.5 | 1.5 | 2 |
| Leveling agent | | F-222 | E | 0.03 | 0.03 | 0.03 | 0.02 | 0.03 | 0.03 | 0.03 |
| Solvent | | 2-butanone | F | 43 | 43 | 43 | 43 | 43 | 43 | 43 |
| Evaluation of resolution | | | | ○ | ○ | ○ | ○ | ○ | ○ | ○ |
| Evaluation of adhesive force | | | | ○ | ○ | ○ | ○ | ○ | ○ | ○ |
| Condensation test | | | | ○ | ○ | ○ | ○ | ○ | ○ | ○ |

TABLE 3

Formulations and evaluation results of photosensitive resin compositions

| Component | | | | Comparative Example 1 | 2 | 3 | 4 | 5 | 6 | 7 | 8 |
|---|---|---|---|---|---|---|---|---|---|---|---|
| Component (A) | Component (a-1) | KM-N LCL | A-1 | 80 | | 80 | 80 | 80 | 50 | | 50 |
| | | NC-3000H | A-2 | | | | | | | | |
| | | EOCN-104S | A-3 | | | | | | | | |
| | | EPPN-502S | A-4 | | | | | | | | |
| | | NC-6700 | A-5 | | | | | | | | |
| | | DE-102 | A-6 | | | | | | | | |
| | | JER-4007P | A-7 | | 10 | | | | | | |

TABLE 3-continued

Formulations and evaluation results of photosensitive resin compositions

| Component | | | | Comparative Example 1 | 2 | 3 | 4 | 5 | 6 | 7 | 8 |
|---|---|---|---|---|---|---|---|---|---|---|---|
| | Component (a-2) | Synthesis Example 1 | A-8 | | 60 | | | | | | |
| | Component (a-3) | RE-310S | A-9 | 20 | | 20 | 20 | 20 | 50 | 100 | |
| | | RE-305S | A-10 | | | | | | | | |
| | | TEPIC-VL | A-11 | | | | | | | | |
| | | EX-321L | A-12 | | | | | | | | |
| | | OXT-221 | A-13 | | | | | | | | 50 |
| | | Celloxide 2021P | A-14 | | | | | | | | |
| | | YDF-8170C | A-15 | | 40 | | | | | | |
| Component (B) | | Irg290 | B-1 | 1 | 2 | 1 | 1 | 1 | 1 | 1 | 1 |
| Component (C) | Compound of Formula (1) | TPPO | C-1 | | | | | | 0.02 | 0.02 | 0.02 |
| | Compound other than Formula (1) | TINUBIN 770DF | C-2 | | | 0.02 | | | | | |
| | | SP-152 | C-3 | | | | 0.02 | | | | |
| | | CPF310CS | C-4 | | | | | 0.02 | | | |
| Coupling agent | | S-510 | D | 1.5 | 2 | 1.5 | 1.5 | 1.5 | 1.5 | 1.5 | 1.5 |
| Leveling agent | | F-222 | E | 0.03 | | 0.03 | 0.03 | 0.03 | 0.03 | 0.03 | 0.03 |
| Solvent | | 2-butanone | F | 43 | 43 | 43 | 43 | 43 | 43 | 43 | 43 |
| Evaluation of resolution | | | | ○ | ○ | x | x | x | ○ | ○ | ○ |
| Evaluation of adhesive force | | | | x | ○ | — | — | — | ○ | ○ | x |
| Condensation test | | | | x | x | — | — | — | x | x | x |

TABLE 4

Formulations and evaluation results of photosensitive resin compositions

| Component | | | | Comparative Example 9 | 10 | 11 |
|---|---|---|---|---|---|---|
| Component (A) | Component (a-1) | KM-N LCL | A-1 | | | |
| | | NC-3000H | A-2 | | | |
| | | EOCN-104S | A-3 | | | |
| | | EPPN-502S | A-4 | | | |
| | | NC-6700 | A-5 | | | |
| | | DE-102 | A-6 | | | |
| | | JER-4007P | A-7 | | | |
| | Component (a-2) | Synthesis Example 1 | A-8 | | | |
| | Component (a-3) | RE-310S | A-9 | | | |
| | | RE-305S | A-10 | | | |
| | | TEPIC-VL | A-11 | | | |
| | | EX-321L | A-12 | | | |
| | | OXT-221 | A-13 | 100 | | 50 |
| | | Celloxide 2021P | A-14 | | 100 | 50 |
| | | YDF-8170C | A-15 | | | |
| Component (B) | | Irg290 | B-1 | 1 | 1 | 1 |
| Component (C) | Compound of Formula (1) | TPPO | C-1 | 0.02 | 0.02 | 0.02 |
| | Compound other than Formula (1) | TINUBIN 770DF | C-2 | | | |
| | | SP-152 | C-3 | | | |
| | | CPI-310CS | C-4 | | | |
| Coupling agent | | S-510 | D | 1.5 | 1.5 | 1.5 |
| Leveling agent | | F-222 | E | 0.03 | 0.03 | 0.03 |
| Solvent | | 2-butanone | F | 43 | 43 | 43 |
| Evaluation of resolution | | | | x | ○ | ○ |
| Evaluation of adhesive force | | | | — | x | x |
| Condensation test | | | | — | x | x |

From the results in Tables 1 to 4, it is apparent that the photosensitive resin compositions according to the present invention (Examples 1 to 15) were superior to the photosensitive resin compositions of Comparative Examples 1 to 11 in all of the resolution of the resist, the adhesive force to the Si substrate, and the effect of preventing condensation.

INDUSTRIAL APPLICABILITY

The photosensitive resin composition according to a preferred aspect of the present invention enables formation of a pattern having high adhesion to a substrate and has a noticeably excellent effect of preventing condensation, and therefore can provide a resin molded product resistant to a durability test such as a reflow test, particularly in the fields of MEMS components, MEMS package components, semiconductor packages, and the like.

The invention claimed is:

1. A photosensitive resin composition, comprising: a cationic curable resin (A), a photocationic polymerization initiator (B), and a quencher (C), wherein the cationic curable resin (A) contains a polyfunctional epoxy resin (a-1) having a softening point of 50° C. or higher and/or an acid-modified product (a-2) of a polyfunctional epoxy resin having a softening point of 50° C. or higher in an amount of 60 mass % or more, and the quencher (C) contains a compound represented by Formula (1) below:

(1)

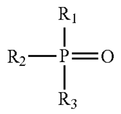

wherein $R_1$ to $R_3$ each independently represent an alkyl group or a phenyl group.

2. The photosensitive resin composition according to claim 1, wherein $R_1$ to $R_3$ are phenyl groups.

3. A dry film resist formed from the photosensitive resin composition according to claim 1.

4. A dry film resist formed from the photosensitive resin composition according to claim 2.

5. A cured product of the photosensitive resin composition according to claim 1.

6. A cured product of the photosensitive resin composition according to claim 2.

* * * * *